US008211784B2

(12) United States Patent
Hong et al.

(10) Patent No.: US 8,211,784 B2
(45) Date of Patent: Jul. 3, 2012

(54) METHOD FOR MANUFACTURING A SEMICONDUCTOR DEVICE WITH LESS LEAKAGE CURRENT INDUCED BY CARBON IMPLANT

(75) Inventors: Jason Hong, San Jose, CA (US); Daniel Tang, Fremont, CA (US)

(73) Assignee: Advanced Ion Beam Technology, Inc., San Jose, CA (US)

( * ) Notice: Subject to any disclaimer, the term of this patent is extended or adjusted under 35 U.S.C. 154(b) by 151 days.

(21) Appl. No.: 12/588,703

(22) Filed: Oct. 26, 2009

(65) Prior Publication Data

US 2011/0095339 A1    Apr. 28, 2011

(51) Int. Cl.
*H01L 21/425* (2006.01)
*H01L 21/265* (2006.01)

(52) U.S. Cl. ........ 438/527; 438/529; 438/530; 438/301; 257/219; 257/353; 257/611; 257/655; 257/E21.619; 257/E21.634

(58) Field of Classification Search .................. 438/289, 438/301, 305–307, 506, 508, 510–541; 257/101, 257/219–221, 285, 335, 345, 404, 607, 611, 257/657, E21.12, E21.618, E21.619, E21.633, 257/E21.634, E21.639
See application file for complete search history.

(56) References Cited

U.S. PATENT DOCUMENTS

| | | | | |
|---|---|---|---|---|
| 4,004,950 | A * | 1/1977 | Baruch et al. ................ | 438/186 |
| 5,770,512 | A * | 6/1998 | Murakoshi et al. ........... | 438/520 |
| 7,776,697 | B2 * | 8/2010 | Currie et al. ................. | 438/285 |
| 7,927,989 | B2 * | 4/2011 | Zhang et al. ................. | 438/524 |
| 8,017,487 | B2 * | 9/2011 | Chong et al. ................. | 438/300 |
| 2005/0054168 | A1 * | 3/2005 | Currie et al. ................. | 438/300 |
| 2005/0112835 | A1 * | 5/2005 | Sa ................................. | 438/305 |
| 2005/0170594 | A1 * | 8/2005 | Yeo et al. ..................... | 438/300 |
| 2006/0006427 | A1 * | 1/2006 | Tan et al. ..................... | 257/227 |
| 2006/0216900 | A1 * | 9/2006 | Wang et al. .................. | 438/306 |
| 2006/0255330 | A1 * | 11/2006 | Chen et al. ................... | 257/18 |
| 2007/0117326 | A1 * | 5/2007 | Tan et al. ..................... | 438/266 |
| 2007/0148888 | A1 * | 6/2007 | Krull et al. ................... | 438/306 |
| 2007/0164356 | A1 * | 7/2007 | Adam et al. .................. | 257/347 |
| 2007/0235802 | A1 * | 10/2007 | Chong et al. ................. | 257/346 |
| 2007/0252205 | A1 * | 11/2007 | Hoentschel et al. .......... | 257/347 |
| 2007/0254461 | A1 * | 11/2007 | Wei et al. ..................... | 438/514 |
| 2007/0293003 | A1 * | 12/2007 | Currie et al. ................. | 438/197 |
| 2008/0050881 | A1 * | 2/2008 | Chen et al. ................... | 438/301 |
| 2008/0090393 | A1 * | 4/2008 | Aderhold et al. ............ | 438/530 |
| 2008/0157119 | A1 * | 7/2008 | Tsai ............................... | 257/190 |
| 2009/0068810 | A1 * | 3/2009 | Tsai et al. ..................... | 438/300 |
| 2009/0075029 | A1 * | 3/2009 | Thomas et al. ............... | 428/173 |
| 2009/0085035 | A1 * | 4/2009 | Giles ............................. | 257/60 |
| 2009/0127620 | A1 * | 5/2009 | Kohli et al. ................... | 257/343 |
| 2009/0130805 | A1 * | 5/2009 | Babcock et al. ............. | 438/151 |
| 2009/0221123 | A1 * | 9/2009 | Griebenow et al. .......... | 438/305 |

(Continued)

*Primary Examiner* — Laura M Menz
*Assistant Examiner* — Maliheh Malek
(74) *Attorney, Agent, or Firm* — Rosenberg, Klein & Lee (57) ABSTRACT

A semiconductor device has at least two main carbon-rich regions and two additional carbon-rich regions. The main carbon-rich regions are separately located in a substrate so that a channel region is located between them. The additional carbon-rich regions are respectively located underneath the main carbon-rich regions. The carbon concentrations is higher in the main carbon-rich regions and lower in the additional carbon-rich regions, and optionally, the absolute value of a gradient of the carbon concentration of the bottom portion of the main carbon-rich regions is higher than the absolute value of a gradient of the carbon concentration of the additional carbon-rich regions. Therefore, the leakage current induced by a lattice mismatch effect at the carbon-rich and the carbon-free interface can be minimized.

7 Claims, 8 Drawing Sheets

300b

U.S. PATENT DOCUMENTS

| | | | |
|---|---|---|---|
| 2009/0261379 A1* | 10/2009 | Falck et al. | 257/133 |
| 2009/0278177 A1* | 11/2009 | Sankin et al. | 257/272 |
| 2010/0025771 A1* | 2/2010 | Hoentschel et al. | 257/369 |
| 2010/0029053 A1* | 2/2010 | Itokawa et al. | 438/306 |
| 2010/0105185 A1* | 4/2010 | Ku et al. | 438/301 |
| 2010/0112766 A1* | 5/2010 | Liu et al. | 438/232 |
| 2010/0144110 A1* | 6/2010 | Wang et al. | 438/305 |
| 2010/0164001 A1* | 7/2010 | Park et al. | 257/369 |
| 2010/0193882 A1* | 8/2010 | Hoentschel et al. | 257/410 |
| 2010/0221883 A1* | 9/2010 | Kronholz et al. | 438/285 |
| 2010/0221902 A1* | 9/2010 | Ye et al. | 438/494 |
| 2010/0237440 A1* | 9/2010 | Ito | 257/408 |
| 2010/0240201 A1* | 9/2010 | Yin et al. | 438/527 |
| 2010/0252866 A1* | 10/2010 | Peidous et al. | 257/255 |
| 2010/0320546 A1* | 12/2010 | Tamura | 257/408 |
| 2011/0074498 A1* | 3/2011 | Thompson et al. | 327/543 |
| 2011/0163386 A1* | 7/2011 | Jeong et al. | 257/369 |
| 2011/0306193 A1* | 12/2011 | Krull et al. | 438/515 |
| 2012/0001228 A1* | 1/2012 | Chong et al. | 257/190 |

* cited by examiner

METHOD FOR MANUFACTURING A SEMICONDUCTOR DEVICE WITH LESS LEAKAGE CURRENT INDUCED BY CARBON IMPLANT

FIELD OF THE INVENTION

The present invention generally relates to a semiconductor device and a method for manufacturing the same, and more particularly to a semiconductor device with less leakage current induced by carbon implant and a method for manufacturing the same.

DESCRIPTION OF THE RELATED ART

To improve transistor performance, one approach is providing stress to the transistor channels. For example, implanting carbon into the substrate of the N channel metal oxide semiconductor (NMOS) transistor and annealing it to form the SiC layers may provide the channel region with lateral tensile stress. Herein, the source and the drain may be located in the SiC layers or above the SiC layers. Hence, the silicon lattice in the channel is stretched by lateral tensile stress and then the electrons can move more easily from the source through the stretched channel region to the drain. As a result, mobility of the charger carrier in the NMOS transistor is improved.

Figure 1A:
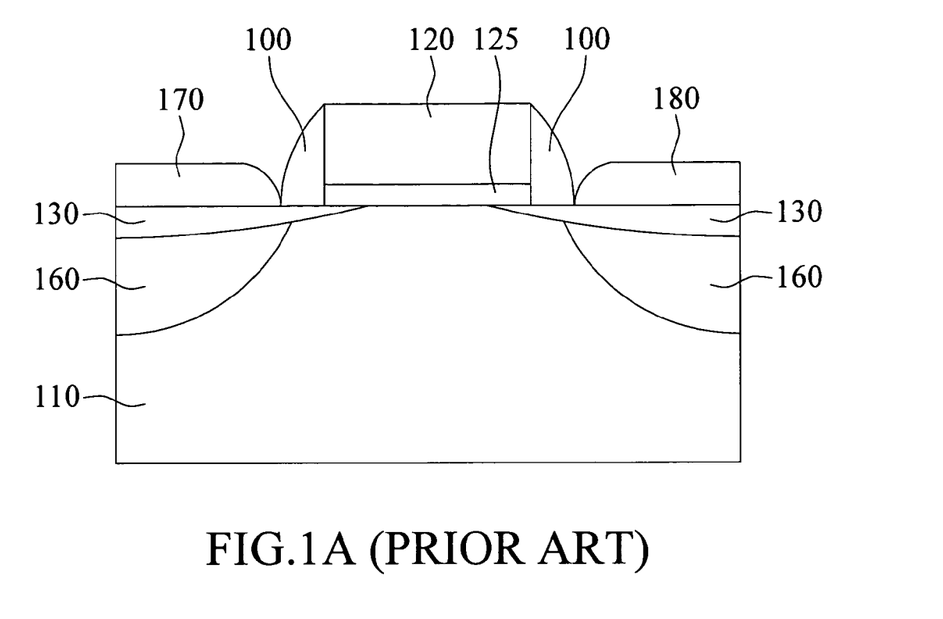

FIG. 1A illustrates a schematic view of a conventional NMOS transistor. In the prior art, carbon is implanted into the carbon-rich regions 160, of the substrate 110, and then an annealing process is performed to re-crystallize the lattice, so as to form and activate the carbon-rich regions (SiC) 160 in the silicon substrate 110. Apparently, the formation of the carbon-rich regions 160 requires two different processes, an implantation process and an annealing process, and two different apparatuses, an ion implanter and an annealing apparatus. Herein, the source 170 and the drain 180 are located above the carbon-rich regions 160, and over the surface of the substrate 100. Besides, the conventional NMOS transistor has gate electrode 120, gate dielectric layer 125, source and drain tip regions 130 and spacer 100. Herein, they are not related to the formation of the carbon-rich regions 160.

Figure 1B:
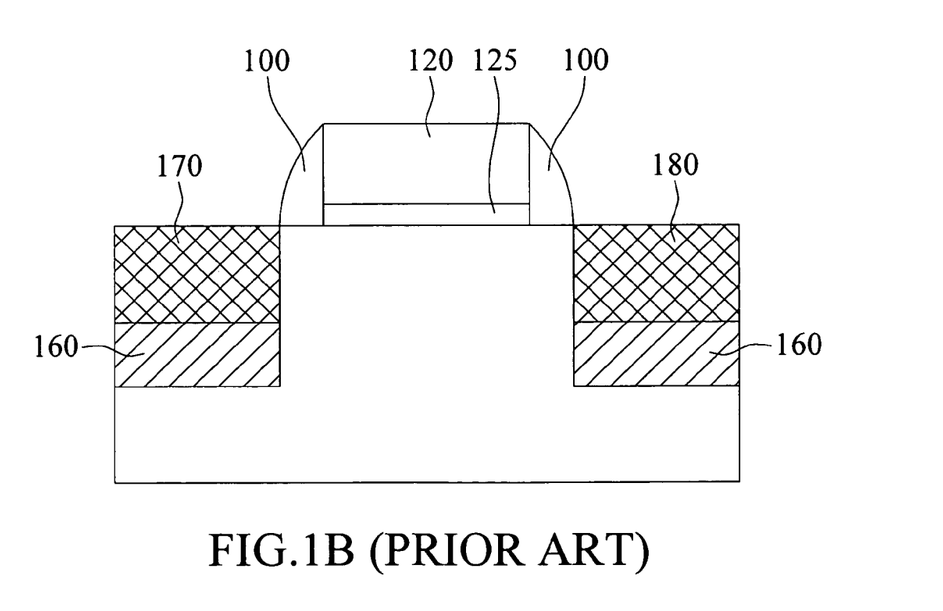
Figure 1C:
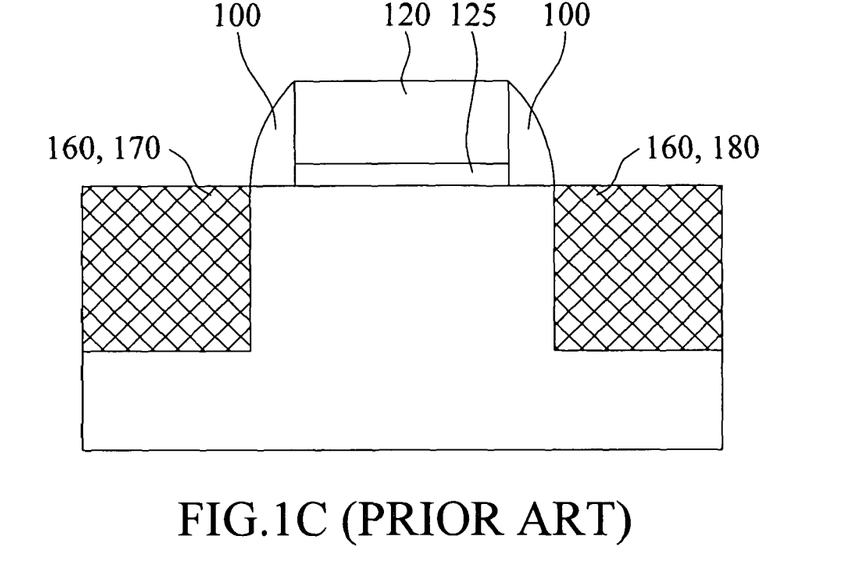
FIG. 1C respectively illustrates the schematic views of some conventional NMOS.

FIG. 1B and FIG. 1C respectively illustrates the schematic view of another two conventional NMOS transistors. The two prior arts are similar with the above prior art, beside the relation between the carbon-rich regions 160 and both the source 170 and the drain 180. In the prior art shown in FIG. 1B, whole the carbon-rich regions 160 is doped to form the source 170 and the drain 180, and there is no drain tip regions 130. In the prior art shown in FIG. 1C, only an upper portion of the carbon-rich regions 160 is doped to form the source 170 and the drain 180, and there is no drain tip regions 130.

The carbon-rich regions 160 fabricated by the above-mentioned manufacturing method, however, may have leakage defects due to the lattice mismatch at the carbon-rich and carbon-free interface. The relative abrupt change in the concentration distribution at the end-of-range (EOR) of carbon implant defines the bottom edge of the carbon-rich regions 160. The defect is a result of the lattice mismatch between the carbon-rich regions 160 and the silicon lattices of the substrate 110 which contributes to a junction leakage.

One prior art improves the above leakage current by implanting low-dose donors, such as phosphorous, into a portions of the substrate 110 below the carbon-rich regions 160. Herein, the low-dose donors may suppress the leakage current. However, by performing such process, the source and drain junction depth, which is an important factor for transistor scaling, in increased. The electric property of the fabricated semiconductor device may be affected by this additional junction depth such as transistor off current leakage and threshold voltage roll off effect.

Accordingly, it is still desirable to use different method rather than the P implant to improve the above leakage current while keeping the enhanced stress to transistor channel.

SUMMARY OF THE INVENTION

The present invention is directed to a semiconductor device and a method for manufacturing the same, wherein the possibility of lattice mismatch between the carbon-rich region and the non-implanted substrate region may be effectively minimized.

One embodiment provides a semiconductor device comprising two main carbon-rich regions and two additional carbon-rich regions. The main carbon-rich regions are separately located in a substrate so that a channel region is formed between the main carbon-rich regions. The additional carbon-rich regions are respectively located underneath the main carbon-rich regions. Carbon concentrations of the main carbon-rich regions are higher than carbon concentrations of the additional carbon-rich regions. By properly controlling implant energy and dose of the carbon implanted into the additional carbon-rich regions, the defective leakage current can be significantly reduced due to the elimination of the abrupt lattice mismatch at the carbon-rich and Si-substrate (carbon-free) interface. The additional carbon-rich regions acts as a buffer zone between the carbon-rich and Si-substrate (carbon-free), and provide a gradual transition for reducing stress seen by the substrate.

Another embodiment provides a method for manufacturing a semiconductor device described as above. The method comprises providing a substrate, and forming main carbon-rich regions and additional carbon-rich regions in the substrate. Wherein, the main carbon-rich regions are separately located in the substrate so that a channel region is formed between the main carbon-rich regions. In addition, the additional carbon-rich regions are respectively formed below the main carbon-rich regions. Herein, the carbon concentrations of the carbon-rich regions are higher than the carbon concentrations of the additional carbon-rich regions. The leakage current vertically flows through the main carbon-rich region into the portion of the substrate below both the main carbon-rich regions and the additional carbon-rich regions is greatly reduced due to the improvement of EOR defect by proper control of the lattice mismatch coefficient to below a critical point, beyond which lattice can shift at the interface.

BRIEF DESCRIPTION OF THE DRAWINGS

FIG. 1A to FIG.

DETAILED DESCRIPTION OF THE INVENTION

Reference will now be made in detail to specific embodiments of the present invention that are illustrated in the accompanying drawings. While the invention is described in conjunction with these specific embodiments, it is not intended to limit the invention to these embodiments. In contrast, it is intended to cover alternatives, modifications, and equivalents as may be included within the spirit and scope of the invention as defined by the appended claims. The present invention may be practiced without at least one of these specific details.

Figure 2A:
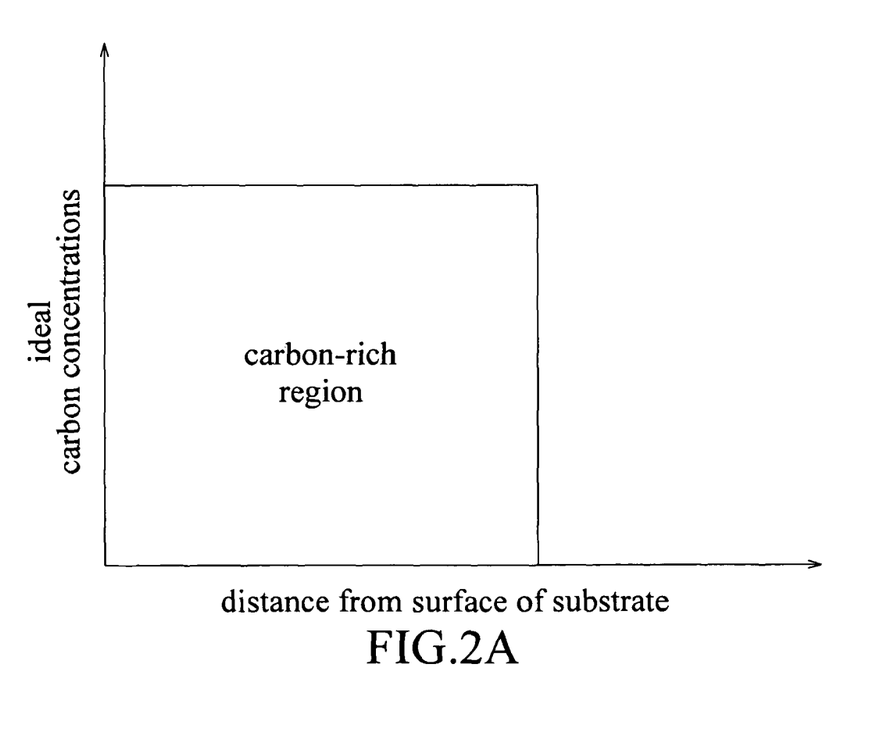
FIG. 2A to FIG. 2D illustrate the mechanism and characteristics of an embodiment of the present invention.
Figure 2B:
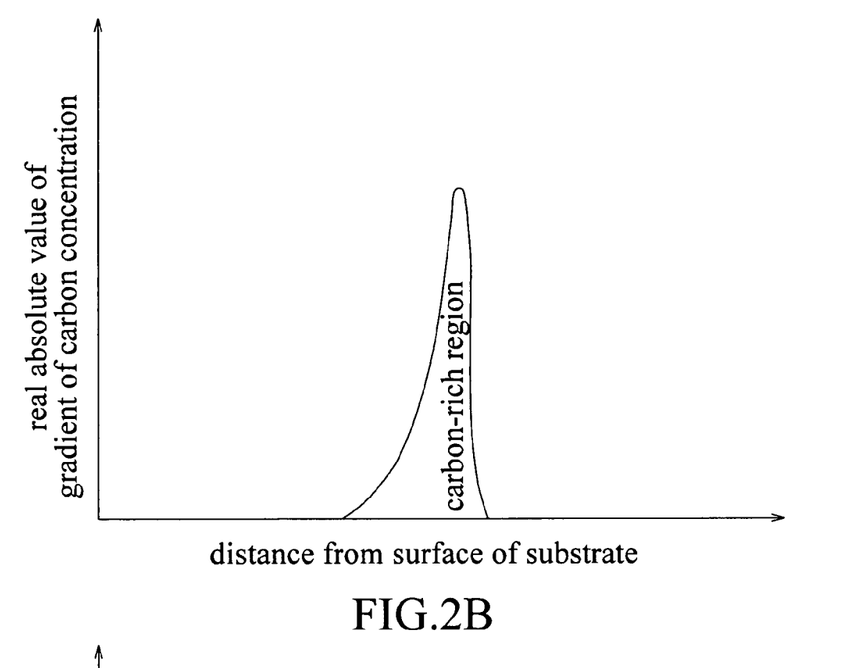

One embodiment for showing some characteristics of this invention is illustrated in FIG. 2A to FIG. 2D. FIG. 2A shows an ideal carbon-concentration vs. depth (measured from the top surface of a substrate) relation of a carbon-rich region with a specific dose, and FIG. 2B shows a real absolute value of gradient of carbon concentration vs. depth (measured from the top surface of a substrate) relation of a carbon-rich region with a specific dose. Herein, the difference between the ideal relation and the real depth relation is essentially induced by the thermal diffusion induced by an annealing process for enhance the formation of SiC or the imperfect operation of a process for forming the carbon-rich region. Then, the ideal absolute value of gradient of carbon concentration vs. depth relation should be a delta function at the bottom surface of the carbon region. But, because the carbon distribution will be broadened in the real world, the real absolute value of gradient of carbon concentration vs. depth relation will have clear non-zero value among a small range (which is distributed around the bottom surface of the carbon region.)

Figure 2C:
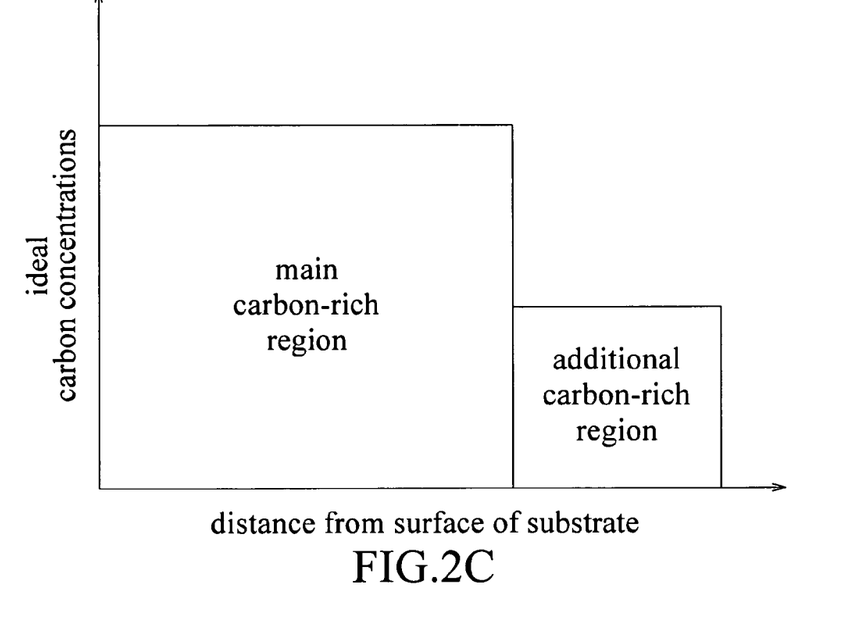
Figure 2D:
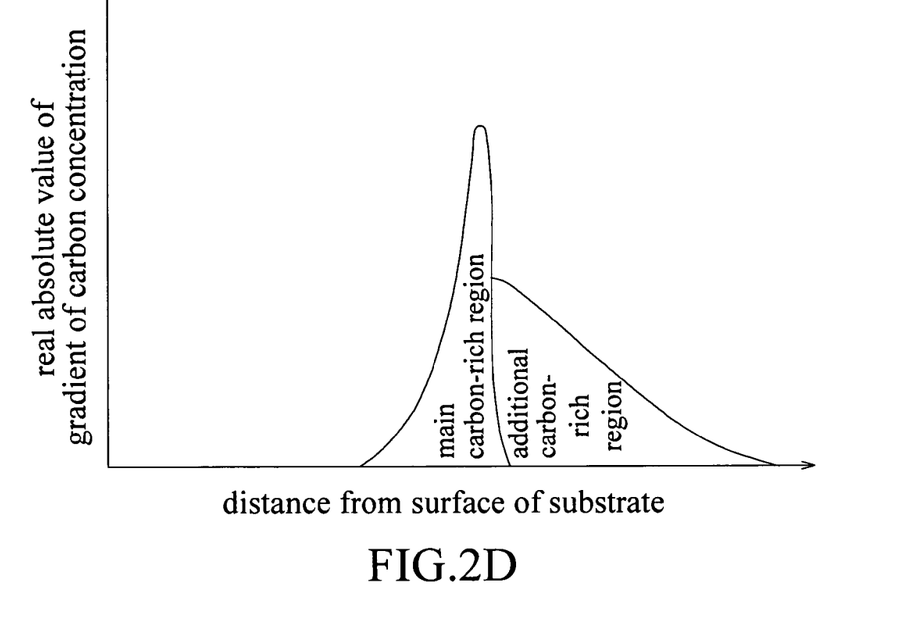

Clearly, for both real and ideal situations, there is an abrupt variation of carbon concentration and then a junction leakage induced by the lattice mismatch at the carbon-rich to carbon-free interface is unavailable. Two main characteristics of the invention are shown in FIG. 2C and FIG. 2D respectively. Herein, FIG. 2C shows an ideal carbon-concentration vs. depth (measured from the top surface of a substrate) relation of a carbon-rich region formed by a main carbon-rich region with higher dose and an additional carbon-rich region with lower dose, and FIG. 2D shows a real absolute value of gradient of carbon concentration vs. depth (measured from the top surface of a substrate) relation of a carbon-rich region formed by a main carbon-rich region with a sharp gradient of carbon concentration in its bottom portion and an additional carbon-rich region with a gradual gradient of carbon concentration.

Accordingly, one main characteristic of the embodiment the additional carbon-rich region with less carbon concentration located between a main carbon-rich region for inducing a stress in the channel region and a below underneath carbon-free substrate. Hence, in the prior art, there is a larger carbon concentration difference between the main carbon-rich region and the below carbon-free substrate. In contrast, in this invention, the larger carbon concentration difference is divided into two smaller differences: One is located between the main carbon-rich region and the additional carbon-rich region, and another is located between the additional carbon-rich region and the below carbon-free substrate. Therefore, in the invention, the carbon concentration difference at the carbon-rich to carbon-free interface can be decreased, and than the leakage current can be minimized.

Accordingly, another main characteristic of the embodiment is the additional carbon-rich region with gradual gradient of carbon concentration located between a main carbon-rich region for inducing a stress in the channel region and a carbon-free substrate. Hence, in the prior art, there is a sharp gradient of carbon concentration difference between the bottom portion of the main carbon-rich region and the below carbon-free substrate. In contrast, in this invention, the sharp gradient of carbon concentration is replaced by a gradual gradient of carbon concentration, because the variation of carbon concentration is distributed over a larger range (from the bottom portion of the main carbon-rich region through the additional carbon-rich region to the below carbon-free substrate). Therefore, in the invention, the lattice mismatch around the carbon-rich to carbon-free interface may be smoother, and then the leakage current can be minimized.

Figure 3A:
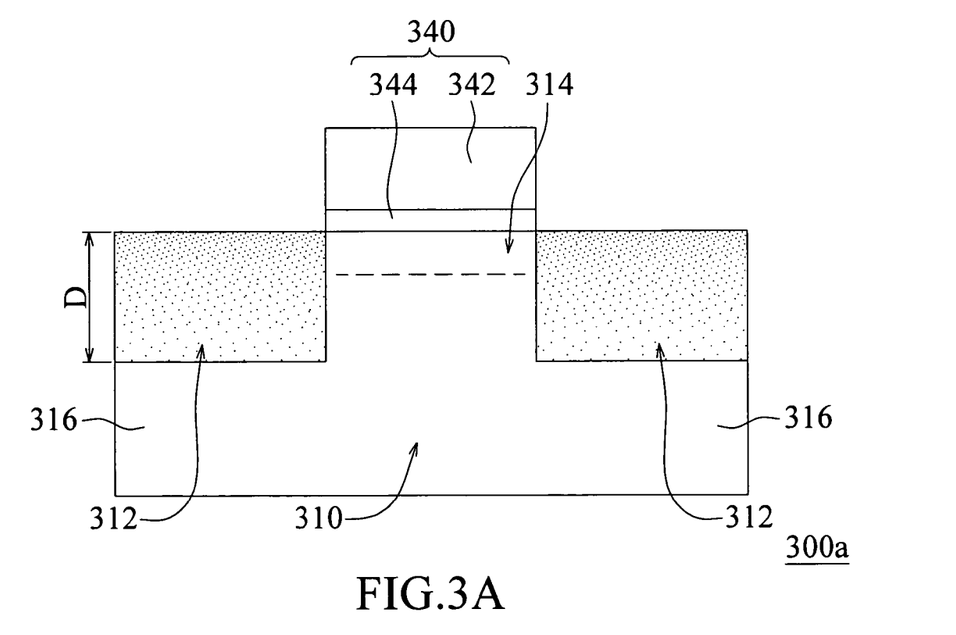
FIG. 3A to FIG. 3B illustrates respectively a schematic view of a semiconductor device according to two embodiment of the present invention.

FIG. 3A illustrates a schematic view of a semiconductor device according to an embodiment of the present invention. Referring to FIG. 3A, the semiconductor device 300a, for example but not limited to, a metal-oxide-semiconductor field-effect (MOSFET) transistor, is provided. For a typical semiconductor device 300a, a substrate 310 may be a wafer or a die and include monocrystalline silicon, polycrystalline silicon, amorphous silicon, silicon on insulator, or other suitable materials. Furthermore, the substrate 310 may be doped to form well regions therein. As shown, the semiconductor device 300a has a gate 340 that may include a gate dielectric 344 and a gate electrode 342 above the gate dielectric 344. Optionally, the gate 340 may further include a spacer (not shown) on the sidewall of the gate electrode 342 and the gate dielectric 344. For example, the gate electrode 342 may include, a metal, polysilicon, or pre-doped polysilicon, and the gate dielectric 344 may be formed from an insulative material. Herein, as shown in FIG. 1A to FIG. 1C, the distribution of the carbon-rich region 160 is independent on the distribution of the source 170 and the drain 180. Hence, in this and the below embodiments, both the source and the drain (even the gate sometimes) are omitted, to simplify the discussion and avoid the un-necessary limitation on what kind of source/drain is used in the semiconductor device having a channel stretched by the carbon (or SiC).

Furthermore, two carbon-rich regions 312 are separately located in the substrate 310, and a channel region 314 may be located underneath the gate 340 and between the carbon-rich regions 312. In one example, each of the carbon-rich regions 312 is formed by a carbon implantation process, even further by an annealing process to anneal the substrate 310 with the implanted carbon. The carbon concentrations of the carbon-rich regions 312 essentially decrease gradually with an increasing depth D, which indicates herein the depth measured from the surface of the substrate 310, so that the concentration of the carbon implant at the bottom edges of the carbon-rich regions 312 is at a minimal level. Herein, the bottom edges are defined by the concentration distribution at the end of range (E.O.R.) of carbon implant. Therefore, the lattice mismatch between the bottom edges of the carbon-rich regions 312 and the underneath non-implanted substrate regions 316 may be effectively reduced by the gradually decreased concentrations of carbon implant, especially by the gradually decreased lattice mismatch around the carbon-rich and carbon-free interface. Hence, the leakage current that would be induced at this interface may be reduced. Moreover, the portion of the carbon-rich region 312 nearest to the channel region 314 has a relatively higher concentration of the carbon implant, which is beneficial to stretch the silicon lattice in the channel region 214.

Figure 3B:
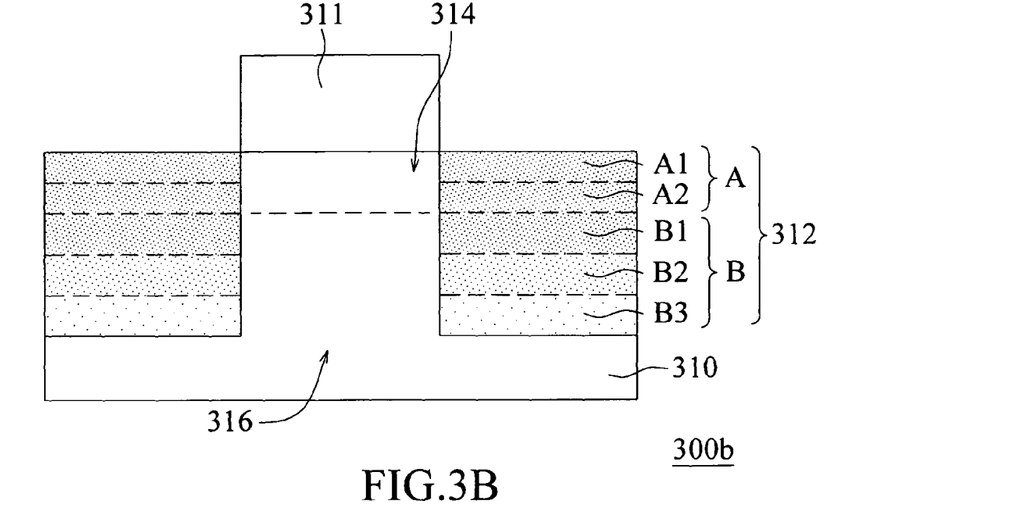

Referring to FIG. 3B, each of the carbon-rich regions 312 in the semiconductor device 300b may comprise a main carbon-rich region A with uniform carbon concentrations and an additional carbon-rich region B located below the main carbon-rich region A with non-uniform carbon concentrations. The main carbon-rich regions A are separately located in the substrate 310 so that the channel region 314 is formed therebetween and underneath a gate 311. In addition, the carbon concentrations of the main carbon-rich regions A are higher than the carbon concentrations of the additional carbon-rich regions B.

In a detailed example, each of the main carbon-rich regions A may comprise some implanted layers, such as A1 and A2, contacted with the channel region 314, and each of the additional carbon-rich regions B may comprise some implanted layers, such as B1, B2, B3, which are essentially not in contact with the channel region 314. Herein, the depth of the channel region 314 is variable, essentially at least decided by the quality, such as electric property, of the substrate 210 and the voltage applied on the gate 311.

Both of the implanted layers A1 and A2 have an essentially uniform carbon concentration for uniformly applying lateral tensile stress to the substrate material inside the channel region 314, and uniformly enhancing the mobility of charge carriers in the channel region 314. On the other hand, all of the implanted layers B1, B2, B3 proximate to the main carbon-rich regions A are implanted with lower implanting energies and higher implanting doses, such that the carbon concentrations of the additional carbon-rich regions B may essentially decrease gradually with an increasing depth from the main carbon-rich regions A.

Figure 4:
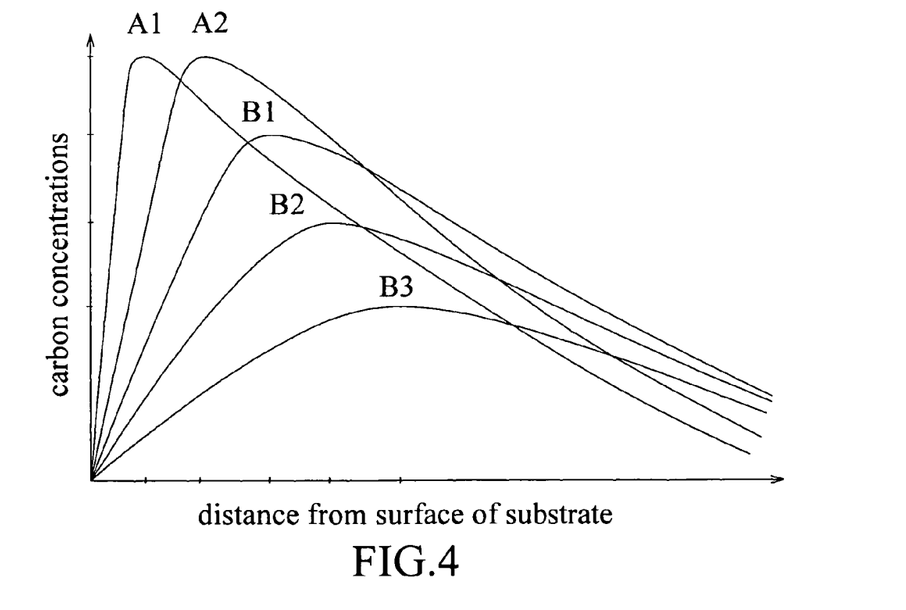
FIG. 4 illustrates a relationship between carbon concentrations of the implanted layers and the depth measured from the source/drain according to another embodiment of the present inventions.

For example, as shown in FIG. 4, the implanted layers A1, A2 may be implanted with an implanting dose $4E15/cm^2$ and with implanting energies of about 2 KeV and 4 KeV respectively. In addition, the implanted layer B1 may be implanted with an implanting energy about 6 KeV and an implanting dose $3E15/cm^2$. The implanted layer B2 may be implanted with an implanting energy about 8 KeV and an implanting dose $2E15/cm^2$. Furthermore, the implanted layer B3 may be implanted with an implanting energy about 10 KeV and an implanting dose $1E15/cm^2$. In one example, the implanted layers A1, A2, B1, B2 and B3 may be optionally annealed to re-crystallize the lattice after the implantation processes are finished. As a result, the carbon concentration of the implanted layer B2 would be higher than that of the implanted layer B3 but lower than that of the implanted layer B1, and the carbon concentration of the implanted layer A2 would be higher than that of the implanted layer B1 and equal to that of the implanted layer A1. Hence, a ladder-like carbon concentration inside the carbon-rich regions 312 is provided. And then, the difference of carbon concentration between the bottom edges of the additional carbon-rich regions B and the below non-implanted substrate portions 316 is significantly smaller than the difference of carbon concentration between the bottom edges of the main carbon-rich region A and the below non-implanted substrate portions 316. Without doubt, as the additional carbon-rich regions B with gradual gradient of carbon implant concentration essentially are located between the main carbon-rich regions A and the non-implanted substrate portions 316, and then a smaller change in carbon concentration at the interface between the carbon-rich regions 312 and the carbon-free substrate 310 can be resulted, leading to a reduced lattice mismatch at this interface. This will effectively minimize the leakage current induced by the lattice mismatch.

In this embodiment, the gradient of the carbon concentrations in the additional carbon-rich regions B is substantially gradual while the carbon concentration in the main carbon-rich regions A is substantially kept constant. Herein, as discussed above, in ideal situation, the carbon concentration in the main carbon-rich regions A is constant. But, in real situation, owing to the thermal diffusion induced by the annealing process or the imperfect operation of formation of the main carbon-rich regions A, the carbon concentration in the main carbon-rich region may have an abrupt variation in the bottom portion of the main carbon-rich region. However, for both the ideal situation and the real situation, the lattice mismatch at the carbon-rich and carbon-free interface in this embodiment will be smaller than that in the aforementioned prior arts where there is no additional, carbon-rich region B. Hence, the leakage current induced by the lattice mismatch effect, or induced by the sharp variation of crystalline, can be thus effectively decreased. Please note that the non-implanted regions of the substrate can be viewed as having no variation of crystalline induced by the existence of carbon.

In this invention, the carbon concentrations of the implanted layers A1, A2 need not be equal to one another as illustrated in FIG. 4. In another embodiment (not illustrated), the carbon concentration of the implanted layers A1 is higher than that of the implanted layers A2, with the other details identical to those which are shown in FIG. 4. Clearly, the gradual distribution of carbon concentrations in the main carbon-rich regions A may further eliminate/mitigate the large lattice mismatch inside the carbon-rich regions 312. However, the key still is the existence of the additional carbon-rich regions that effectively reduce the lattice mismatch at the interface of the carbon-rich regions 312 and the non-implanted substrate portions 316.

Figure 5:
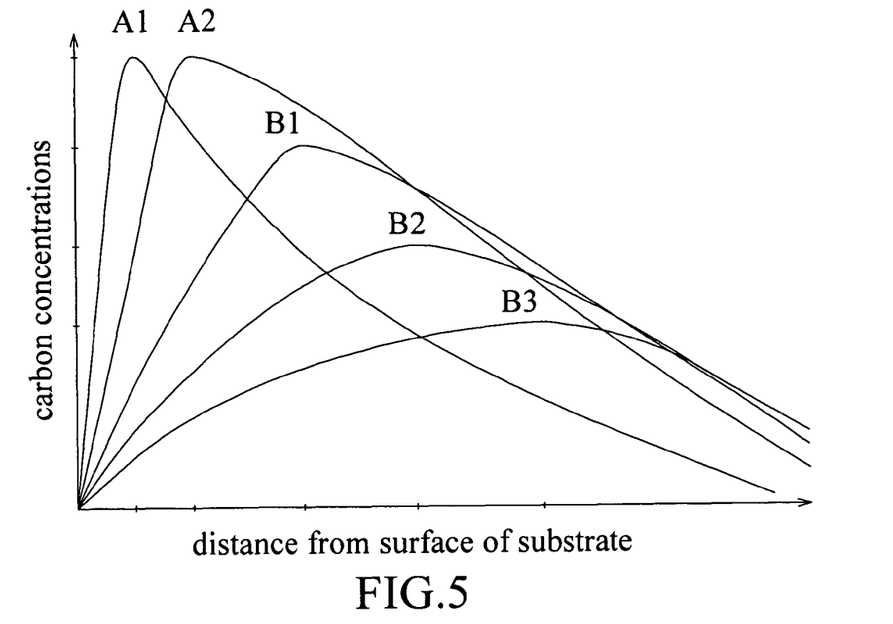
FIG. 5 illustrates a relationship between carbon concentrations of the implanted layers and the depth measured from the source/drain according to another embodiment of the present invention.

FIG. 5 illustrates a relationship between carbon concentrations of each of the implanted layers versus the depth of the measured location from the surface of the substrate according to another embodiment of the present invention. The carbon concentration profile in the present embodiment is similar to that illustrated in the previous embodiment, but the distances between the implanted layers B1, B2, B3 in the additional carbon-rich region B are not. Other conditions are identical to those in the previous embodiment illustrated above and the related discussions will not be repeated herein.

Figure 6A:
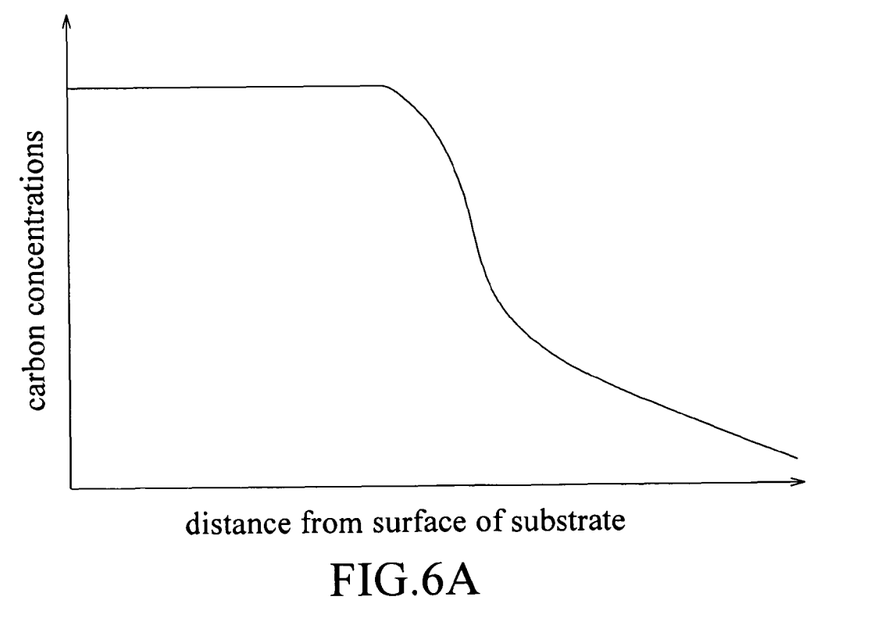
FIG. 6A to FIG. 6D illustrate the mechanism and the differences between the prior art according to another embodiment of the present invention.
Figure 6B:
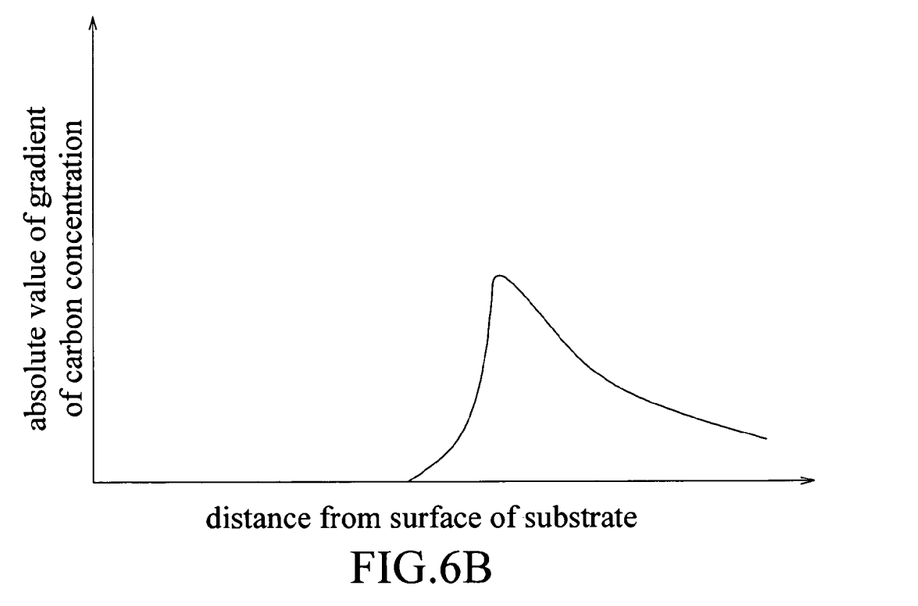

In detail, referring to FIG. 4, the distance between the implanted layers B1 and B2 is equal to that between the implanted layers B2 and B3. In contrast, referring to FIG. 5, the distance between the implanted layers B1 and B2 is smaller than the distance between the implanted layers B2 and B3. The difference is merely a result of the practical processes performed to form these implanted layers B1, B2 and B3 and essentially has no influence on the intended effect of reduced carbon concentration change at the carbon-rich and carbon-free interface. In other words, as long as the carbon concentrations of these implanted layers B1, B2 and B3 are decreased as the depth from the top surface of the substrate is increased, the lattice mismatch effect between the implanted layer B3 and the non-implanted substrate regions 316 may be minimized, regardless of the relative distances between each of these implanted layers B1, B2 and B3. Another embodiment of this invention is illustrated in FIG. 6A and FIG. 6B, and can be further explained by referring to FIG. 6C and FIG. 6D, which illustrate the conditions of the prior arts. In this embodiment, the configuration of a proposed semiconductor device is essentially equal to the above embodiments, and the same discussions will not be repeated here. Moreover, to simplify the figures and particularly emphasize the differences between the invention and the prior arts, all figures only show the absolute value of magnitude of factors intended to be illustrated. Furthermore, as disclosed in the above embodiments, the main difference between the invention and the prior arts is how the lattice mismatch is varied around the carbon-rich to underneath carbon-free interface. Hence, in the FIGS. 6A~6D, the practical carbon concentration distributions of the carbon-rich regions are simplified and only the variation in bottom portions of the carbon-rich regions is illustrated. For example, in real world, how the carbon concentration distribution is varied close to the top surface of the substrate is dependent on whether shallow junction or deep implanted region is to be formed, also the carbon concentration distribution usually has a peak value located immediately below to the top surface of the substrate. But FIGS. 6A~6D omit such details because they are not related to the characteristics of the invention.

Figure 6C:
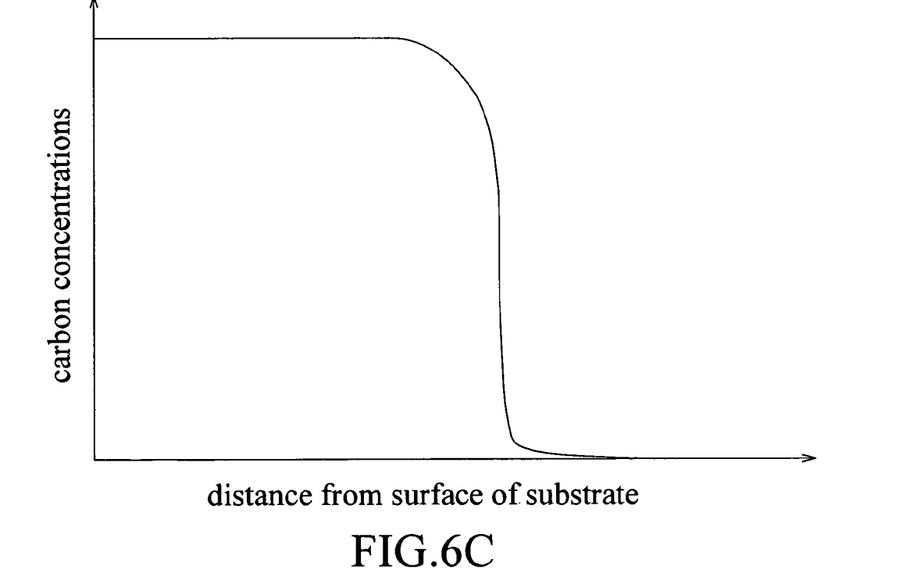

As shown in FIG. 6A, at a depth (measured from the surface of the substrate) which is located in the bottom portion of the carbon-rich region, the carbon concentration is firstly rapidly decreased and then slowly decreased with the increasing depth measured from the surface of the substrate. In contrast, as shown in FIG. 6C, when the depth measured is located in the bottom portion of the carbon-rich region, the carbon concentration is rapidly decreased only. It should be noticed that when the carbon concentration is smaller than a threshold value, for example when the measured location is beyond a particular depth, the lattice mismatch induced by the carbon concentration change is negligible. When such regime is entered, the carbon concentration distribution not only is not shown in the figures for simplicity but also has no visible effect on the mechanism of the proposed invention. By comparing FIG. 6A with FIG. 6C, it can be seen that the main carbon-rich regions correspond to a portion of the overall carbon-rich regions extending from the top surface to the portion of rapidly decreasing carbon concentrations thereof, while the additional carbon-rich regions correspond to the portion of the overall carbon-rich regions where the carbon concentration is slowly decreased.

Figure 6D:
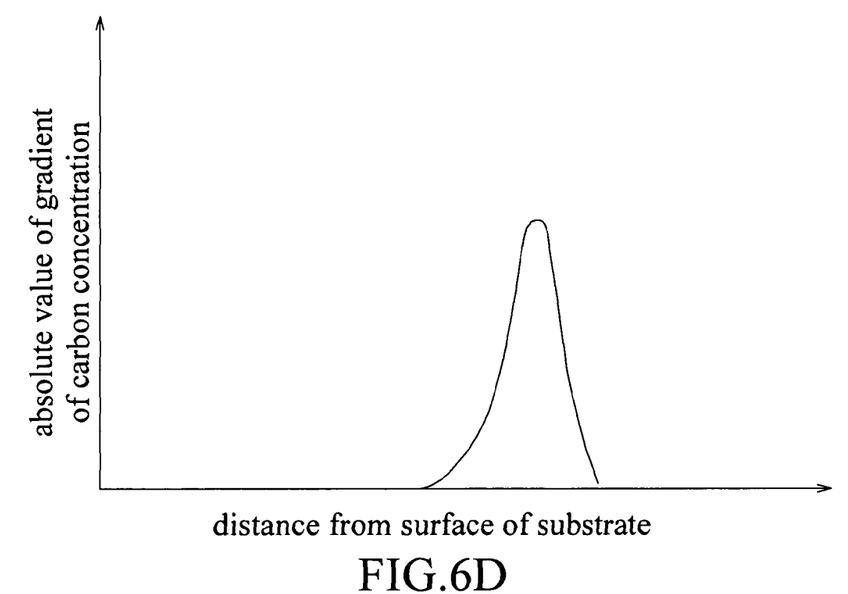

Therefore, as shown in FIG. 6B and FIG. 6D, the absolute value of the magnitude of gradient of carbon concentration is zero for many portions of the carbon-rich region, but is clearly increased as the carbon concentration is obviously decreased with the increasing depth. It is noted that FIG. 6B and FIG. 6D may be similar or equivalent in the zero gradient portions (and regions where the gradient almost is zero). However, due to the existence of the additional carbon-rich regions, FIG. 6B and FIG. 6D must be different at least at the bottom portion of the carbon-rich regions, i.e. in the right-half region in FIGS. 6B and 6D where the absolute value of the magnitude of gradient of carbon concentration rises and then falls again. Herein, as shown in FIG. 6B, the absolute value of the magnitude of gradient of carbon concentrations rises moderately and then falls even more moderately. Optionally, it can rise abruptly and then falls moderately. In contrast, as shown in FIG. 6D, the absolute value of the magnitude of gradient of carbon concentration rises moderately and then falls rapidly. Optionally it can rise and then falls both abruptly.

By comparing FIG. 6B with FIG. 6D, the function of the additional carbon-rich regions can be properly emphasized. In the prior arts, for the bottom portion of the carbon-rich regions, the absolute value of the magnitude of the gradient of carbon concentration is continuously increased before it suddenly falls to zero. Therefore, in the prior arts, for the bottom portion of the carbon-rich region, a significant lattice mismatch is observed around a region where the absolute value of the magnitude of the gradient of carbon concentration suddenly falls to zero. A significant leakage current is thus unavoidably resulted in this region. In contrast, in this embodiment, for the bottom portion of the carbon-rich region, not only the absolute value of the magnitude of the gradient of carbon concentration is smoothly changed around the region where the absolute value of the magnitude of the gradient of carbon concentration suddenly falls to zero in the prior arts, but also that the absolute value of the magnitude of the gradient of carbon concentration falls moderately (for example as the carbon concentration profile extends into the substrate), until it falls below a threshold value and becomes negligible. Therefore, in this embodiment, the lattice mismatch induced by the variation of the carbon concentration is reduced, and the leakage current induced by the lattice mismatch is thus also reduced.

Figure 7:
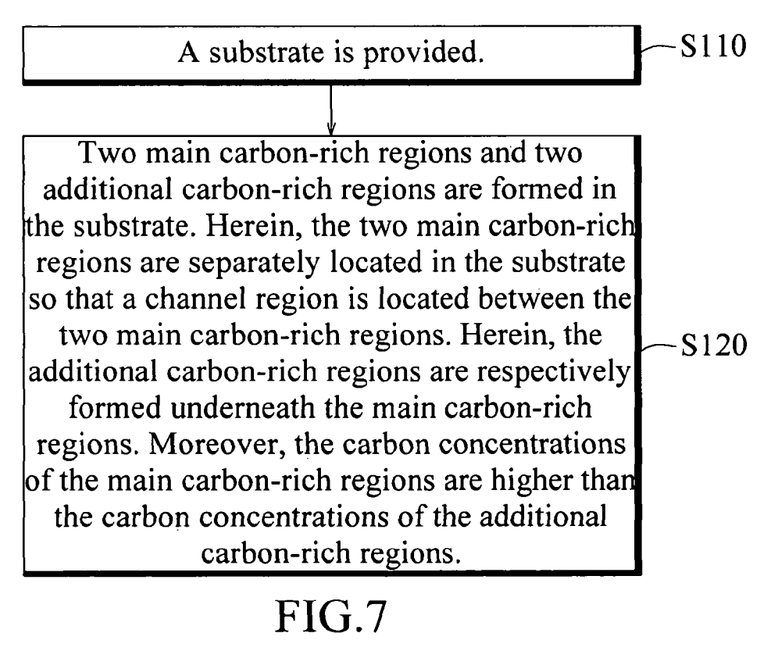
FIG. 7 illustrates a flow chart of a method for manufacturing a semiconductor device according to an embodiment of the present invention.

FIG. 7 illustrates a flow chart of a method for manufacturing a semiconductor device according to an embodiment of the present invention. Herein, the manufactured semiconductor device is similar to that disclosed in the previous embodiments described in conjunction with FIG. 2 and FIG. 3. Referring to FIG. 7, the semiconductor devices may be manufactured by following steps.

First, as shown in block S110, a substrate is provided.

Second, as shown in block S120, two main carbon-rich regions and two additional carbon-rich regions are formed in the substrate. Herein, the two main carbon-rich regions are separately located in the substrate so that a channel region is located between the two main carbon-rich regions. Herein, the additional carbon-rich regions are respectively formed underneath the main carbon-rich regions. Moreover, the carbon concentrations of the main carbon-rich regions are higher than the carbon concentrations of the additional carbon-rich regions.

Note that the details of this embodiment are similar to those in the above embodiments described in conjunction with FIG. 2 to FIG. 6. For example, the effect of existence of the additional carbon-rich regions on the carbon concentration variation, the relation of the carbon concentrations between the main carbon-rich regions and additional carbon-rich regions, and the relation of the absolute value of the gradient of the carbon concentrations between the main carbon-rich regions and additional carbon-rich regions, and so on. Therefore, by properly controlling parameters for both the main carbon-rich regions an the additional carbon-rich regions, such as the carbon concentration distribution at varying depths from the top surface of the substrate, the EOR effect may be improved and then the leakage current which essentially flows vertically from the top surface of the substrate into partial substrate underneath both the main carbon-rich regions and the additional carbon-rich regions is greatly reduced.

Of course, the invention need not limit which portion of the semiconductor device should be formed firstly. Hence, it is possible to form the additional carbon-rich regions before the formation of the main carbon-rich regions, and so on. Similarly, the invention never limits the locations of the source and the drain, also never how to form and when to form the source and the drain. For example, as the prior art, the source and the drain can be located on the carob-rich region, be located in the upper portion of the carbon-rich region or be located in whole the carbon-rich region. In addition, both the main carbon-rich regions and the additional carbon-rich regions may be formed by the carbon implant. Also, for the additional carbon-rich region or the main carbon-rich region, an annealing process usually is performed to ensure the reaction between the implanted carbon and the substrate lattice.

Furthermore, to effectively improve the defect of leakage current, it is proposed in this invention to form additional carbon-rich regions underneath all main carbon-rich regions.

But, the invention also covers the situation that the additional carbon-rich region is formed underneath only one of the main carbon-rich regions. Besides, as the additional carbon-rich regions can be formed in different ways and different forms such as being designed to have varying distances between multiple component carbon-rich layers (which combined form the desired additional carbon-rich regions), it is proposed in this invention to form all additional carbon-rich regions in the same way, or to form individual additional carbon-rich region in different ways.

Although specific embodiments of the present invention have been described, it will be understood by those of skill in the art that there are other embodiments that are equivalent to the described embodiments. Accordingly, it is to be understood that the invention is not to be limited by the specific illustrated embodiments, but only by the scope of the appended claims.

What is claimed is:

1. A method for manufacturing a semiconductor device, comprising:
    providing a substrate;
    forming two main carbon-rich regions and two additional carbon-rich regions in said substrate, wherein said main carbon-rich regions are separately located in said substrate so that a channel region is located between said carbon-rich regions, said additional carbon-rich regions being respectively located underneath said main carbon-rich regions, and
    the carbon concentration of said main carbon-rich regions is higher than the carbon concentration of said additional carbon-rich regions;
    wherein an absolute value of a gradient of said additional carbon-rich regions is adjusted to be smaller than an absolute value of a gradient of a bottom portion of said main carbon-rich regions when both said additional carbon-rich regions and said bottom portion of said main carbon-rich regions have gradually decreasing carbon concentrations with increasing depth measured from a top surface of said main carbon-rich regions.

2. The method as claimed in claim 1, further comprising adjusting a carbon concentration of said additional carbon-rich regions to be decreasing gradually with increasing depth measured from said carbon-rich regions.

3. The method as claimed in claim 1, further comprising forming said additional carbon-rich regions by a plurality of implanted layers, wherein said implanted layers proximate to said main carbon-rich regions are formed with lower implanting energies and higher implanting doses.

4. The method as claimed in claim 1, further comprising forming said additional carbon-rich regions by a plurality of implanted layers, wherein an implanting energy difference between any two neighboring said implanted layers being fixed and an implanting dose of said implanted layers being decreased gradually with increasing depth measured from said carbon-rich regions.

5. The method as claimed in claim 1, further comprising forming said additional carbon-rich regions by a plurality of implanted layers, wherein an implanting energy difference between any two neighboring said implanted layers being increased gradually with increasing depth measured from said carbon-rich regions, wherein an implanting dose of said implanted layers being decreased gradually with increasing depth measured from said carbon-rich regions.

6. The method as claimed in claim 1, further comprising forming said main carbon-rich regions by a plurality of implanted layers in contact with said channel region, wherein all of said implanted layers have a uniform carbon concentration higher than or equal to the carbon concentration of a top portion of said additional carbon-rich regions.

7. The method as claimed in claim 1, further comprising a gate, a source and a drain, wherein said gate is located above said channel region, wherein said source and said drain are located about said main carbon-rich regions or in at least a top portion of said main carbon-rich regions.

* * * * *